(12) United States Patent
Chu et al.

(10) Patent No.: US 7,888,734 B2
(45) Date of Patent: Feb. 15, 2011

(54) HIGH-VOLTAGE MOS DEVICES HAVING GATES EXTENDING INTO RECESSES OF SUBSTRATES

(75) Inventors: Chen-Liang Chu, Hsin-Chu (TW);
Chun-Ting Liao, Hsin-Chu (TW);
Tsung-Yi Huang, Hsin-Chu (TW);
Fei-Yuh Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 123 days.

(21) Appl. No.: 12/328,277

(22) Filed: Dec. 4, 2008

(65) Prior Publication Data

US 2010/0140687 A1 Jun. 10, 2010

(51) Int. Cl.
*H01L 29/66* (2006.01)
(52) U.S. Cl. ............ 257/343; 257/E29.26; 257/E29.258
(58) Field of Classification Search ......... 257/328–330, 257/335, 343, E29.262, E29.26, E29.258, 257/401
See application file for complete search history.

(56) References Cited

U.S. PATENT DOCUMENTS

| 6,144,538 A | 11/2000 | Chao |
| 6,878,596 B2 | 4/2005 | Park et al. |
| 7,518,196 B2 * | 4/2009 | Chau et al. ............ 257/401 |

* cited by examiner

*Primary Examiner*—Zandra Smith
*Assistant Examiner*—Paul E Patton
(74) *Attorney, Agent, or Firm*—Slater & Matsil, L.L.P.

(57) ABSTRACT

An integrated circuit structure includes a high-voltage well (HVW) region in a semiconductor substrate; a first double diffusion (DD) region in the HVW region; and a second DD region in the HVW region. The first DD region and the second DD region are spaced apart from each other by an intermediate portion of the HVW region. A recess extends from a top surface of the semiconductor substrate into the intermediate portion of the HVW region and the second DD region. A gate dielectric extends into the recess and covers a bottom of the recess. A gate electrode is over the gate dielectric. A first source/drain region is in the first DD region. A second source/drain region is in the second DD region.

20 Claims, 12 Drawing Sheets

HIGH-VOLTAGE MOS DEVICES HAVING GATES EXTENDING INTO RECESSES OF SUBSTRATES

TECHNICAL FIELD

This invention relates generally to semiconductor devices, and more particularly to metal-oxide-semiconductor (MOS) devices, and even more particularly to the structure and manufacturing methods of high-voltage MOS devices.

BACKGROUND

High-voltage metal-oxide-semiconductor (HVMOS) devices are widely used in many electrical devices, such as input/output (I/O) circuits, CPU power supplies, power management systems, AC/DC converters, etc. There are a variety of forms of HVMOS devices. A symmetric HVMOS device may have a symmetric structure on the source side and drain side. High voltages can be applied on both drain and source sides. An asymmetric HVMOS device may have asymmetric structures on the source side and drain side. For example, only one of the source side and drain side, typically the drain side, is designed for sustaining high voltages.

FIG. 1 illustrates a conventional HVMOS device, which is also referred to as a double diffusion drain (DDD) MOS device. The HVMOS device includes gate oxide 102a, gate electrode 102b on gate oxide 102a, DDD 103 in substrate 101, and high-voltage junction 107 in DDD 103. Substrate 101 is of an opposite conductivity type than DDD 103. DDD 103 is lightly doped, and has a same conductivity type as high-voltage junction 107.

The conventional HVMOS device suffers from drawbacks. The breakdown voltage of the HVMOS device as shown in FIG. 1 is related to the distance S between high-voltage junction 107 and gate electrode 102b, and the greater distance S is, the higher the breakdown voltage will be. Therefore, to increase the breakdown voltage, the distance S has to be increased. However, the increase in distance S requires the HVMOS device to occupy a greater chip area.

An additional problem is that the breakdown voltage of the HVMOS device as shown in FIG. 1 is related to the distribution of the electrical field, particularly the electrical field between gate electrode 102b and high-voltage junction 107. However, it is difficult to adjust the distribution of the electrical field in the conventional HVMOS device. A solution for the above-discussed problems is needed.

SUMMARY OF THE INVENTION

In accordance with one aspect of the present invention, an integrated circuit structure includes a high-voltage well (HVW) region in a semiconductor substrate; a first double diffusion (DD) region in the HVW region; and a second DD region in the HVW region. The first DD region and the second DD region are spaced apart from each other by an intermediate portion of the HVW region. A recess extends from a top surface of the semiconductor substrate into the intermediate portion of the HVW region and the second DD region. A gate dielectric extends into the recess and covers a bottom of the recess. A gate electrode is over the gate dielectric. A first source/drain region is in the first DD region. A second source/drain region is in the second DD region.

In accordance with another aspect of the present invention, an integrated circuit structure includes a semiconductor substrate; an HVW region of a first conductivity type in the semiconductor substrate; a first DD region in the HVW region, the first DD region being of a second conductivity type opposite the first conductivity type; and a second DD region of the second conductivity type in the HVW region. The first DD region and the second DD region adjoin an intermediate portion of the HVW region between the first DD region and the second DD region. A recess extends from a top surface of the semiconductor substrate into the intermediate portion of the HVW region. The recess has a first sidewall and a second sidewall opposing the first sidewall, wherein the first sidewall is in the second DD region, and the second sidewall is in the intermediate portion of the HVW region. A gate dielectric continuously covers a first top surface of the first DD region and a second top surface of the second DD region, and extends to a bottom of the recess. A gate electrode is over the gate dielectric. A source region is in the first DD region. A drain region is in the second DD region.

In accordance with yet another aspect of the present invention, an integrated circuit structure includes an HVW region of a first conductivity type in a semiconductor substrate; a first DD region in the HVW region, wherein the first DD region is of a second conductivity type opposite the first conductivity type; and a second DD region of the second conductivity type in the HVW region. The first DD region and the second DD region are spaced apart from each other. A gate dielectric is over the HVW region, wherein the gate dielectric includes a first portion lower than a first top surface of the first DD region and a second top surface of the second DD region. The first portion is between the first DD region and the second DD region. The integrated circuit structure further includes a gate electrode over the gate dielectric; a source region in the first DD region; and a drain region in the second DD region.

In accordance with yet another aspect of the present invention, a method of forming an integrated circuit structure includes forming an HVW region in a semiconductor substrate; forming a first DD region in the HVW region; and forming a second DD region in the HVW region. The first DD region and the second DD region are spaced apart from each other by an intermediate portion of the HVW region. The method further includes forming a recess extending from a top surface of the semiconductor substrate into the intermediate portion of the HVW region and the second DD region; forming a gate dielectric extending into the recess and covering a bottom of the recess; forming a gate electrode over the gate dielectric; forming a first source/drain region in the first DD region; and forming a second source/drain region in the second DD region.

In accordance with yet another aspect of the present invention, a method of forming an integrated circuit structure includes forming a first recess and a second recess extending from a top surface of a semiconductor substrate into the semiconductor substrate. The first recess and the second recess are spaced apart from each other. A dielectric material is filled into the first recess and the second recess. The method further includes forming a mask to cover the second recess, wherein the first recess is uncovered by the mask; etching the portion of the dielectric material in the first recess to expose a surface of the semiconductor substrate in the first recess; performing a chemical mechanical polish (CMP) to remove portions of the dielectric material higher than the top surface of the semiconductor substrate; and implanting the semiconductor substrate to form an HVW region in the semiconductor substrate. At least a portion of the HVW region is underlying the first recess. The method further includes implanting the semiconductor substrate to form a first DD region and a second DD region in the HVW region. The first DD region and the second DD region are spaced apart from each other by at least a portion of the first recess. The method further includes forming a gate dielectric covering a bottom of the recess; forming a gate electrode over the gate dielectric; forming a source region in the first DD region; and forming a drain region in the second DD region.

The advantageous features of the present invention include reduced chip area occupied by the HVMOS device and reduced leakage currents. The embodiments of the present invention take advantage of the existing manufacturing process, and do not require additional masks and process steps.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming a high-voltage (HV) metal-oxide-semiconductor (MOS) device is provided. The intermediate stages in the manufacturing of an embodiment of the present invention are illustrated. The variations of the preferred embodiment are then discussed. Throughout the various views and illustrative embodiments of the present invention, like reference numbers are used to designate like elements.

Figure 1:
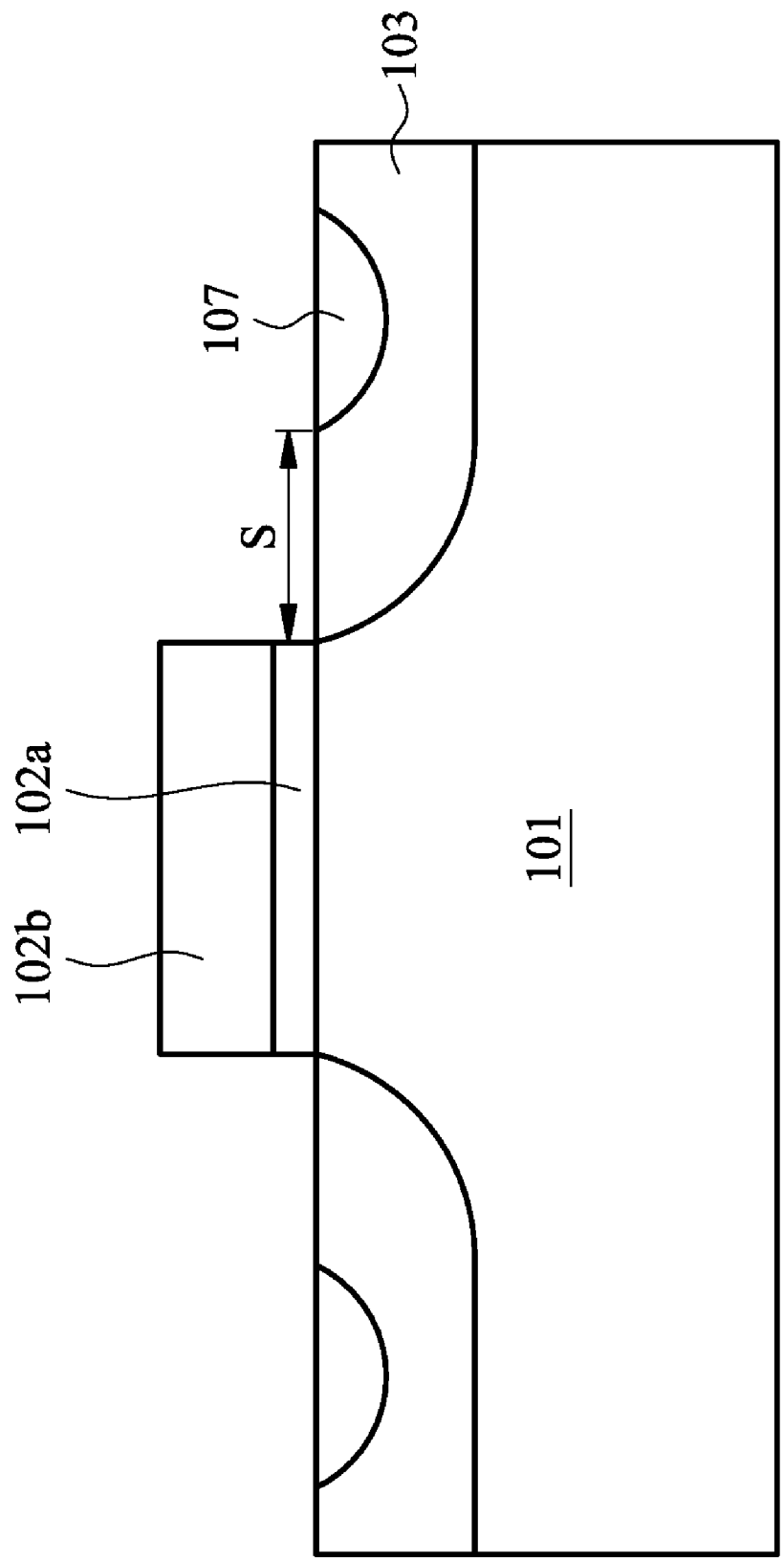
FIG. 1 illustrates a conventional high-voltage metal-oxide-semiconductor (HVMOS) device with a double diffuse drain (DDD)
Figure 2:
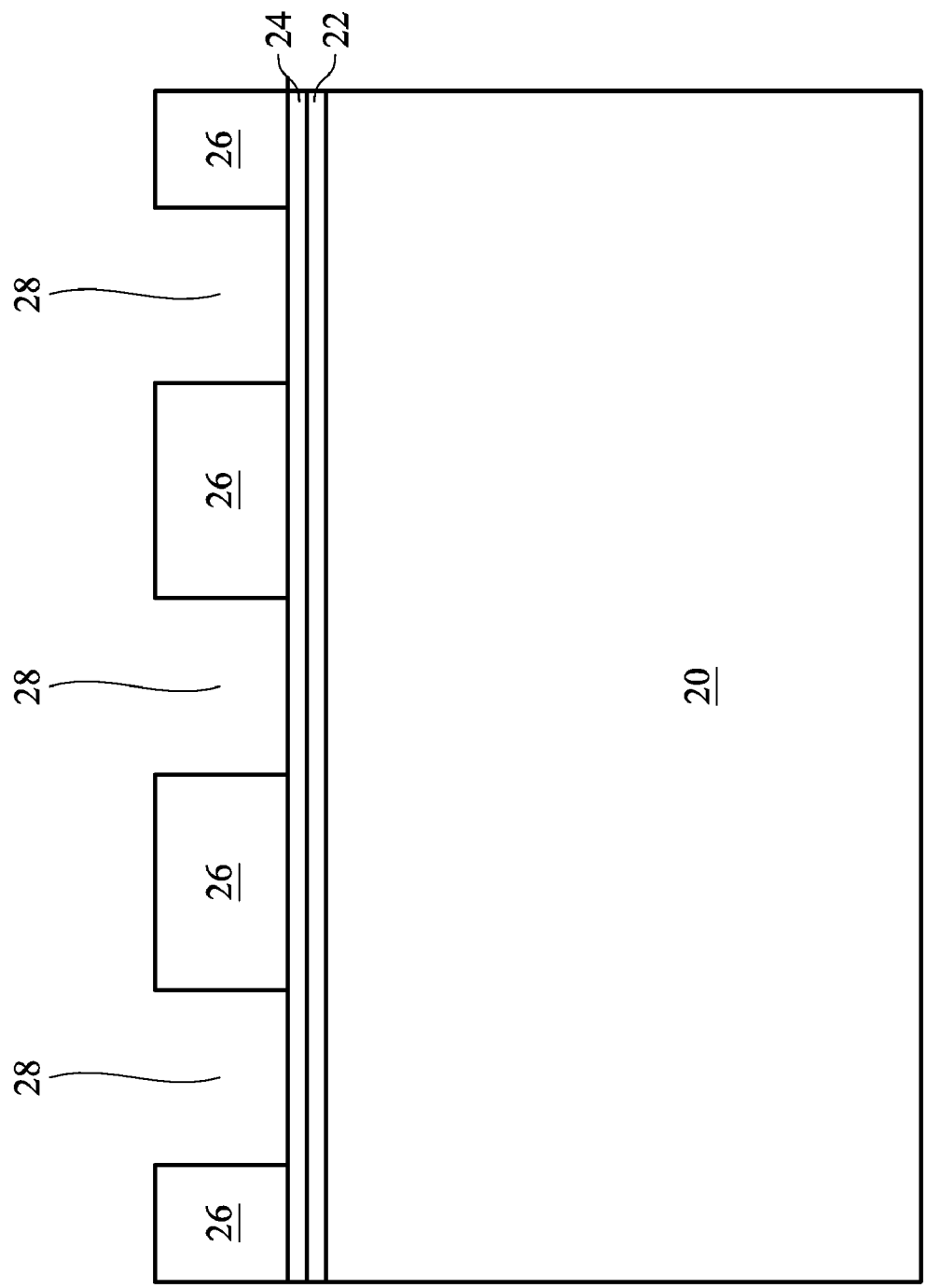
FIGS. 2 through 10 are cross-sectional views of intermediate stages in the manufacturing of an embodiment of the present invention, wherein an HVMOS device having a vertical channel is formed.

Referring to FIG. 2, semiconductor substrate 20 is provided. In the preferred embodiment, semiconductor substrate 20 includes silicon. Other commonly used materials, such as carbon, germanium, gallium, arsenic, nitrogen, indium, phosphorus, and the like, may also be included in semiconductor substrate 20. Semiconductor substrate 20 may be formed of single-crystalline or compound materials, and may be a bulk substrate or a semiconductor-on-insulator (SOI) substrate. In an embodiment, semiconductor substrate 20 is lightly doped as p-type, and hence is referred to as a p-substrate, although it may also be an n-substrate lightly doped as n-type.

Pad layer 22 and mask layer 24 are formed on semiconductor substrate 20. Pad layer 22 is preferably a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In the preferred embodiment, mask layer 24 is formed of silicon nitride, for example, using low-pressure chemical vapor deposition (LPCVD). In other embodiments, mask layer 24 is formed using thermal nitridation of silicon, plasma enhanced chemical vapor deposition (PECVD), or plasma anodic nitridation. Mask layer 24 is used as a hard mask during subsequent photolithography processes. Photoresist 26 is formed on mask layer 24 and is then patterned to form openings 28.

Figure 3:
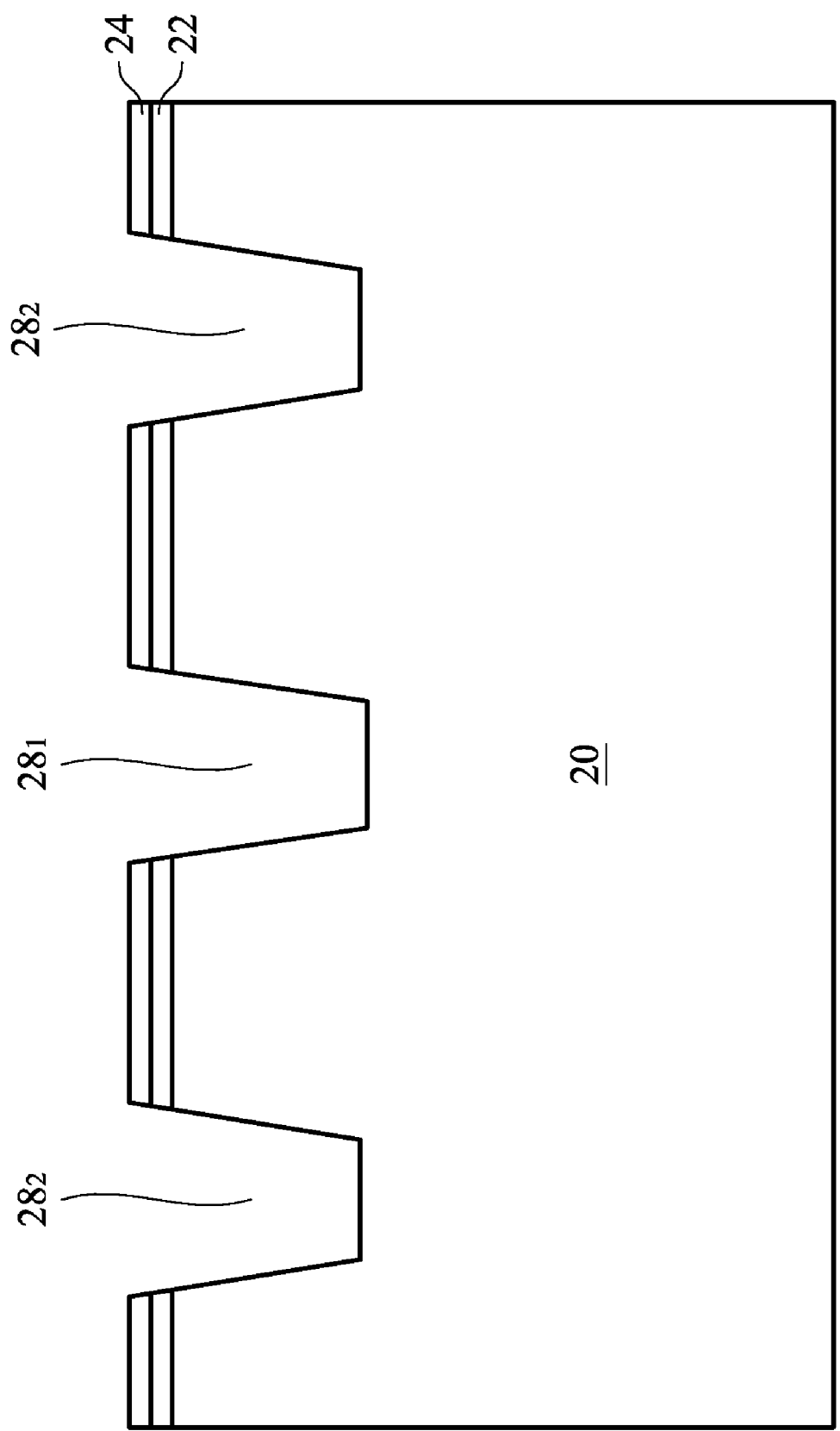

Referring to FIG. 3, mask layer 24 and pad layer 22 are etched through openings 28, exposing underlying portions of semiconductor substrate 20. The exposed portions of semiconductor substrate 20 are then etched so that openings 28 (shown as openings $28_1$ and openings $28_2$) are formed simultaneously and extend into semiconductor substrate 20. Photoresist 26 is then removed. Next, a cleaning is preferably performed to remove a native oxide of semiconductor substrate 20. The cleaning may be performed using diluted HF.

Figure 4:
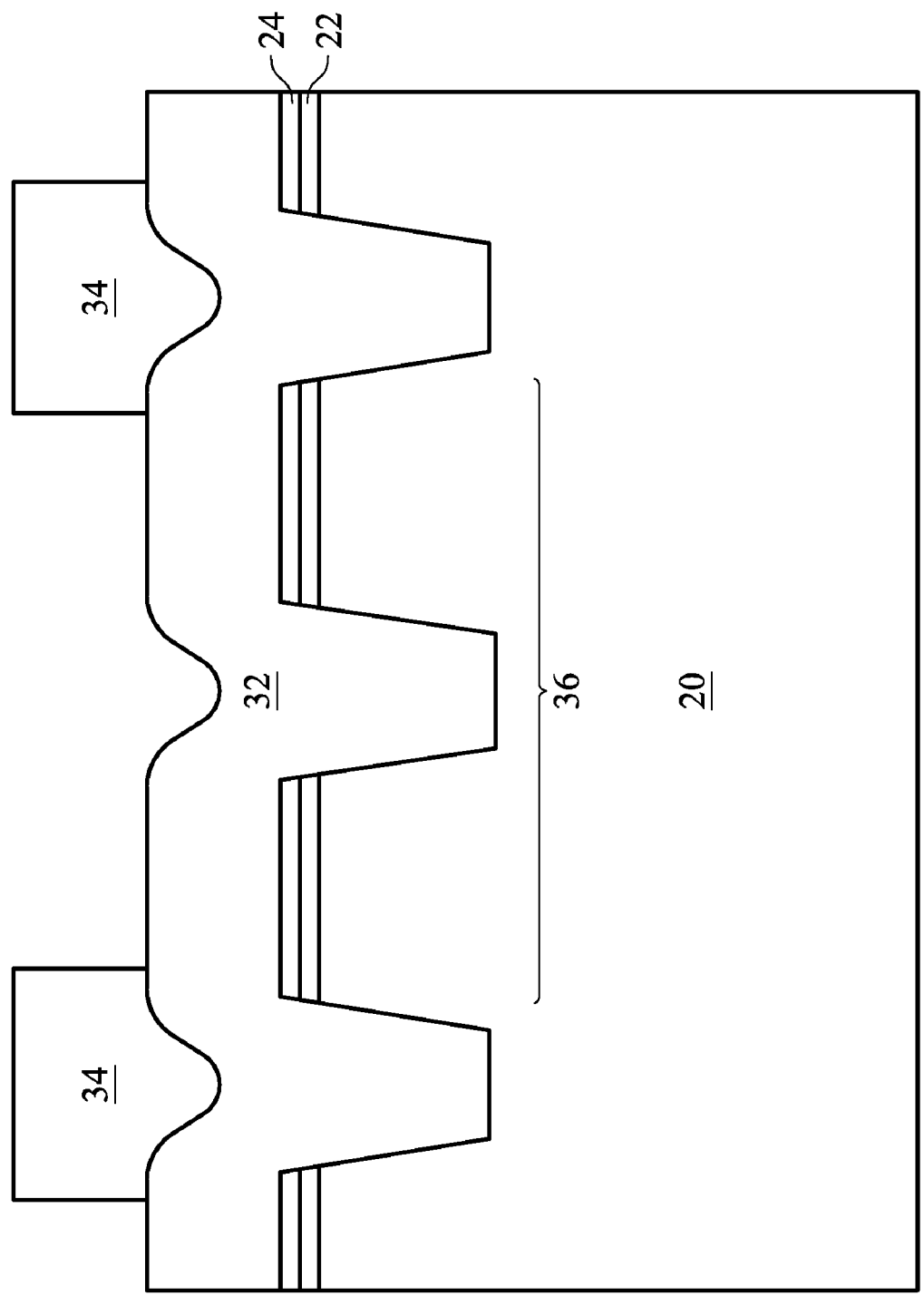

Referring to FIG. 4, openings 28 are filled simultaneously. In an embodiment, an oxidation may be performed first to form an oxide liner (not shown) in the sidewalls of each of openings 28. Dielectric material 32, such as silicon oxide, is then filled into openings 28. The filling method may include high-density chemical vapor deposition (HDCVD), although other methods such as sub-atmospheric chemical vapor deposition (SACVD) and the like may also be used. In the resulting structure, dielectric material 32 is filled to a level higher than the top surface of hard mask 24. Due to the topology on the surface of the respective wafer before the filling process, the portions of the top surface of dielectric material 32 directly over openings 28 are lower than other portions.

Next, as shown in FIG. 4, photoresist 34 is applied and patterned. After the patterning, the remaining portions of photoresist 34 cover the openings $28_2$ (refer to FIG. 3). The future active regions (not shown), for example, the active regions of the core MOS transistors (not shown), are exposed through photoresist 34. Region 36, which includes the region of opening $28_1$ and the adjoining active regions, is also exposed.

Figure 5:
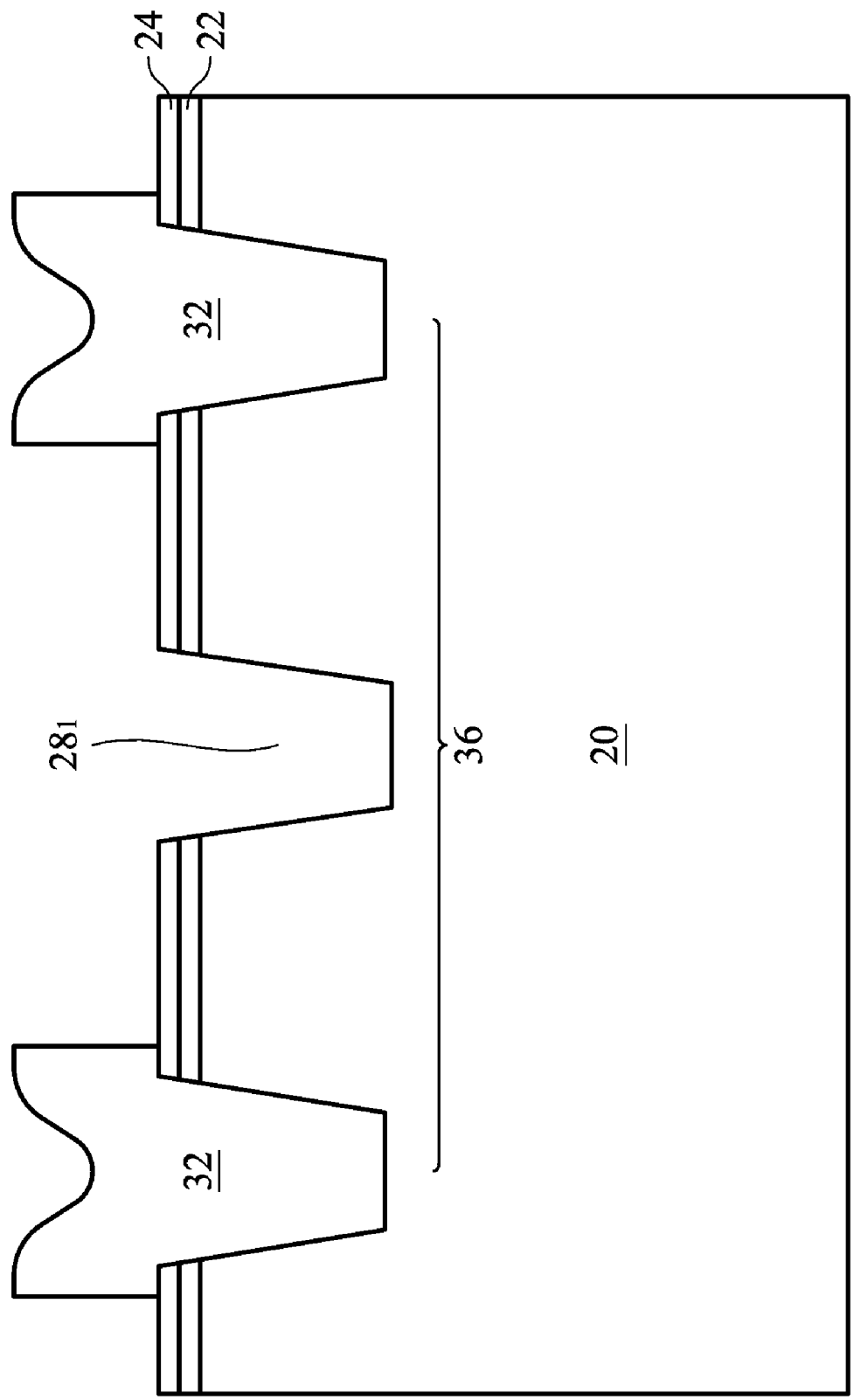

FIG. 5 illustrates the etching of the exposed dielectric material 32. Preferably, in this step, the future shallow trench isolation (STI) regions are not etched, while the excess dielectric material 32 over the active regions (not shown) of core MOS transistors is removed. In the meantime, the dielectric material 32 in region 36, including the portion of dielectric material 32 in opening $28_1$, is also removed, and semiconductor substrate 20 is exposed through opening $28_1$.

Figure 6:
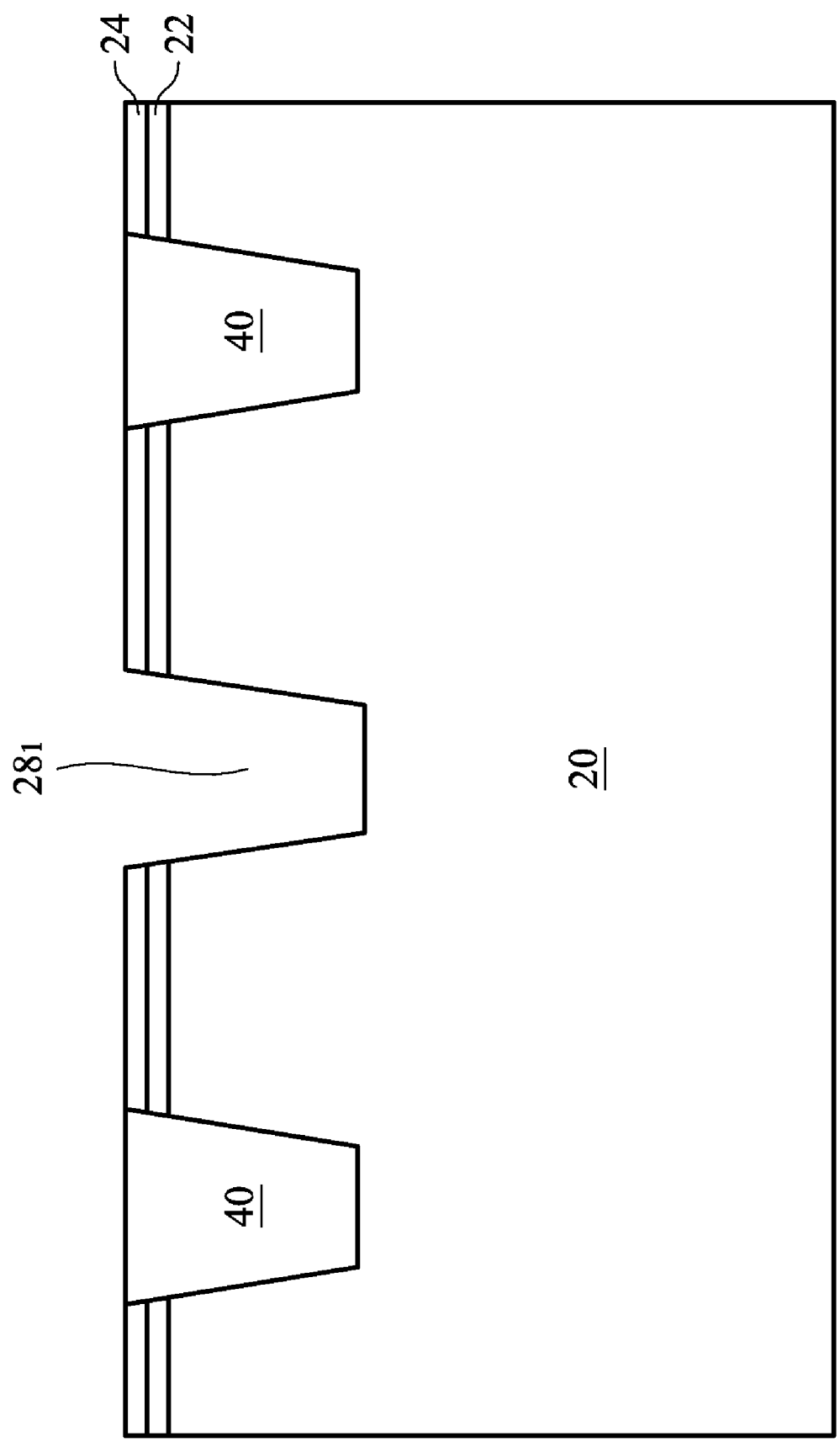
Figure 7:
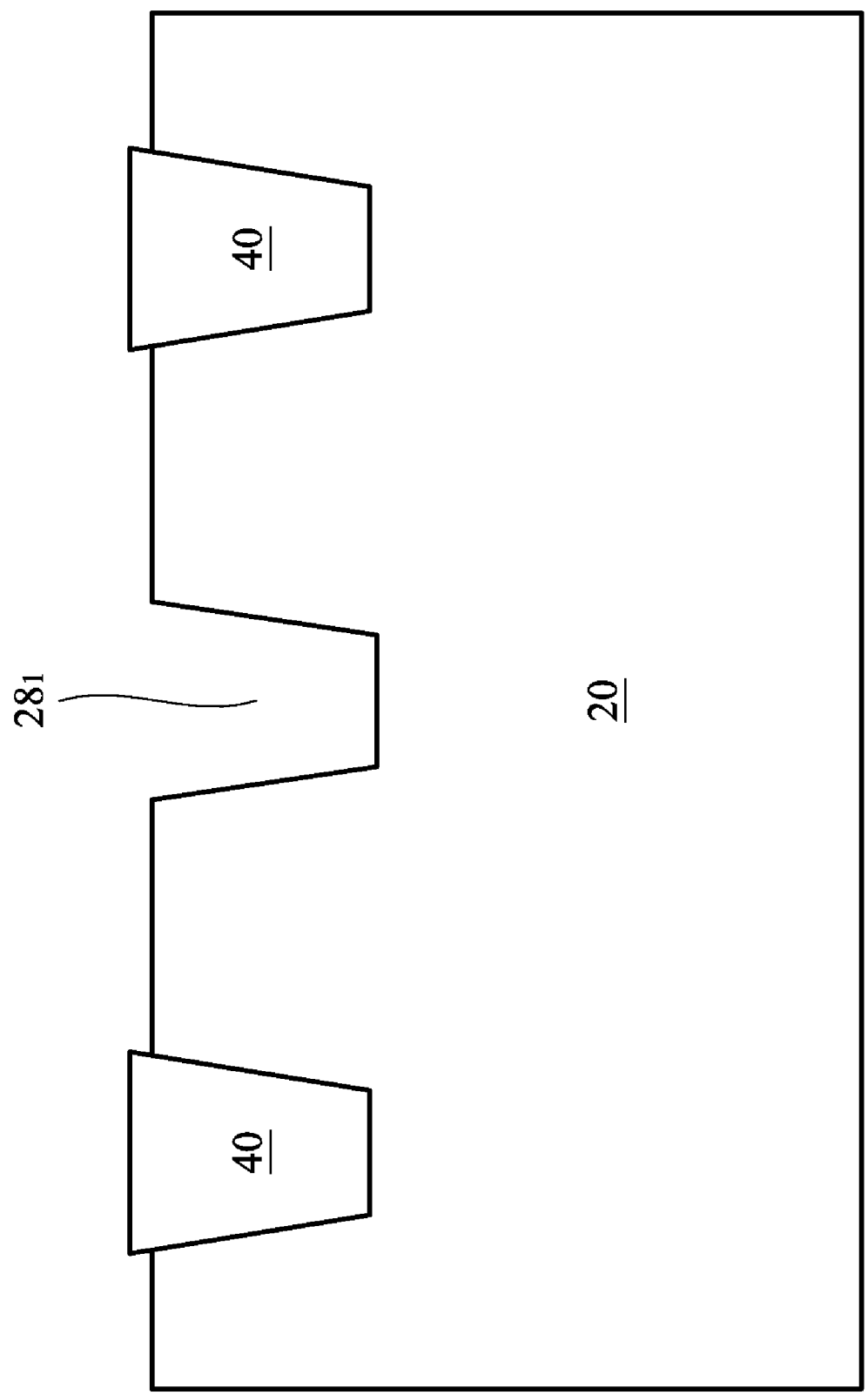

A chemical mechanical polish (CMP) is then performed to remove excess dielectric material 32 above the top surface of hard mask 24, forming a structure as shown in FIG. 6. Mask layer 24 may act as a CMP stop layer. The remaining portions of dielectric material 32 in openings $28_2$ form STI regions 40. Please note that the bottom of opening $28_1$ may be substantially leveled to the bottom surfaces of STI regions 40. Mask layer 24 and pad layer 22 are then removed, as shown in FIG. 7. Mask layer 24, if formed of silicon nitride, may be removed using a wet clean process using hot $H_3PO_4$, while pad layer 22 may be removed using diluted HF if formed of silicon oxide. In alternative embodiments, after the structure as shown in FIG. 5 is formed, pad layer 22 and mask layer 24 are removed first, followed by the CMP process. In this embodiment, semiconductor substrate 20 acts as a CMP stop layer.

Figure 8:
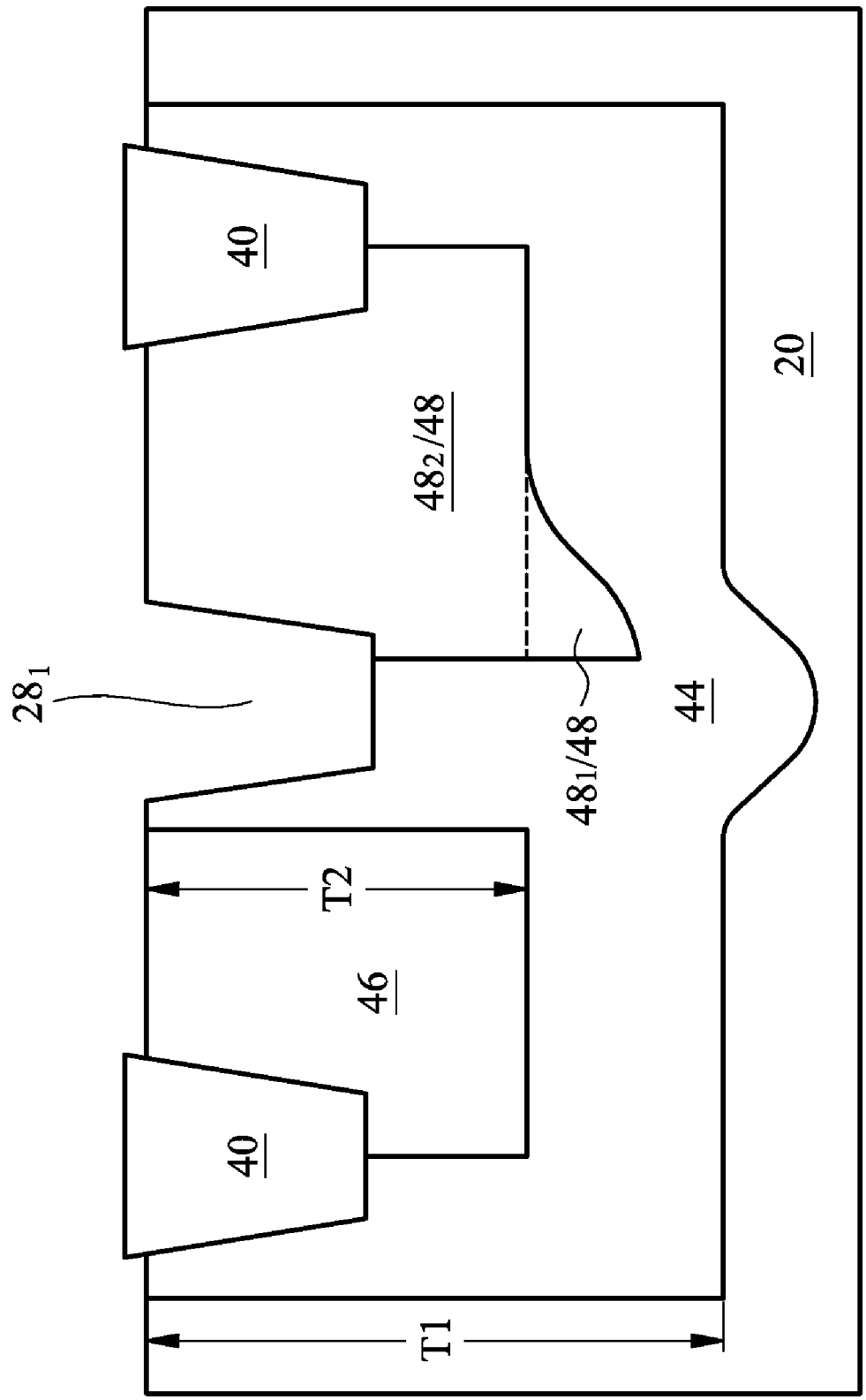

FIG. 8 illustrates the formation of high-voltage p-well (HVPW) 44 and n-type double diffusion (NDD) regions 46 and 48. The formation of HVPW 44 and NDD regions 46 and 48 may be performed by implanting p-type and n-type impurities, respectively. The depth T1 of HVPW 44 is greater than depth T2 of NDD regions 46 and 48, so that NDD regions 46 and 48 are inside HVPW 44. It is noted that due to opening $28_1$ (alternatively referred to as recess $28_1$ hereinafter), NDD region 48 may have a portion $48_1$ extending deeper into semiconductor substrate 20 than other portions $48_2$. Similarly, NDD region 46 and/or HVPW 44 may have portions extending deeper into semiconductor substrate 20 than other portions if these portions are directly underlying opening $28_1$ (not shown in FIG. 8, please refer to FIG. 11).

Figure 9:
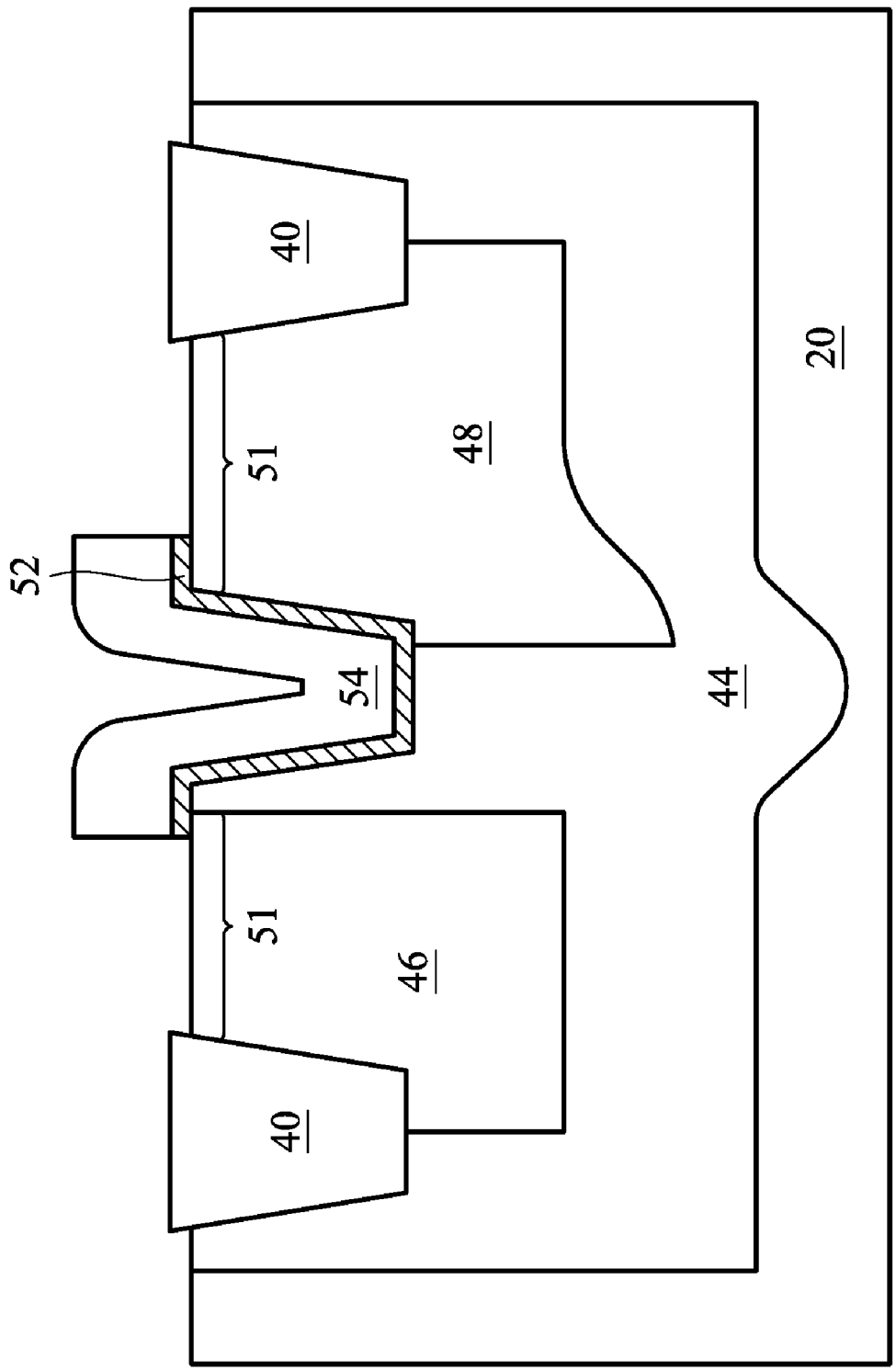

FIG. 9 illustrates the formation of gate dielectric 52 and gate electrode 54, which extend from outside opening $28_1$ into opening $28_1$. In an embodiment, gate dielectric 52 includes silicon oxide. In other embodiments, gate dielectric 52 may be formed of a high-k dielectric material having a high dielectric constant (k value) greater than about 3.9. The preferred materials in gate dielectric layer 52 include silicon oxide, silicon nitride, silicon oxynitride, metal oxides such as $HfO_2$, $HfZrO_x$, $HfSiO_x$, $HfTiO_x$, $HfAlO_x$, combinations thereof, and multi-layers thereof.

Gate electrode 54 is formed on gate dielectric 52. In an embodiment, gate electrode 54 includes polysilicon. Alternatively, gate electrode 54 includes other commonly used conductive materials such as metals, metal nitrides, metal silicides, and combinations thereof. The methods for forming gate dielectric 52 and gate electrode 54 include chemical vapor depositions (CVD) such as low temperature CVD (LTCVD), LPCVD, rapid thermal CVD (RTCVD), plasma enhanced CVD (PECVD), and other commonly used methods such as sputtering, physical vapor deposition (PVD), and the like. The formation of gate electrode 54 and gate dielectric 52 includes forming a gate electrode layer and a gate dielectric layer, and then patterning the gate electrode layer and the gate dielectric layer. Each of gate electrode 54 and gate dielectric 52 includes at least a portion in opening $28_1$, and may, or may not, extend directly over NDD regions 46 and 48. Gate dielectric 52 is preferably highly conformal. The top surfaces of NDD regions 46 and 48 may include substantially flat portions 51, wherein gate dielectric 52 extends directly over portions of flat portions 51.

Figure 10:
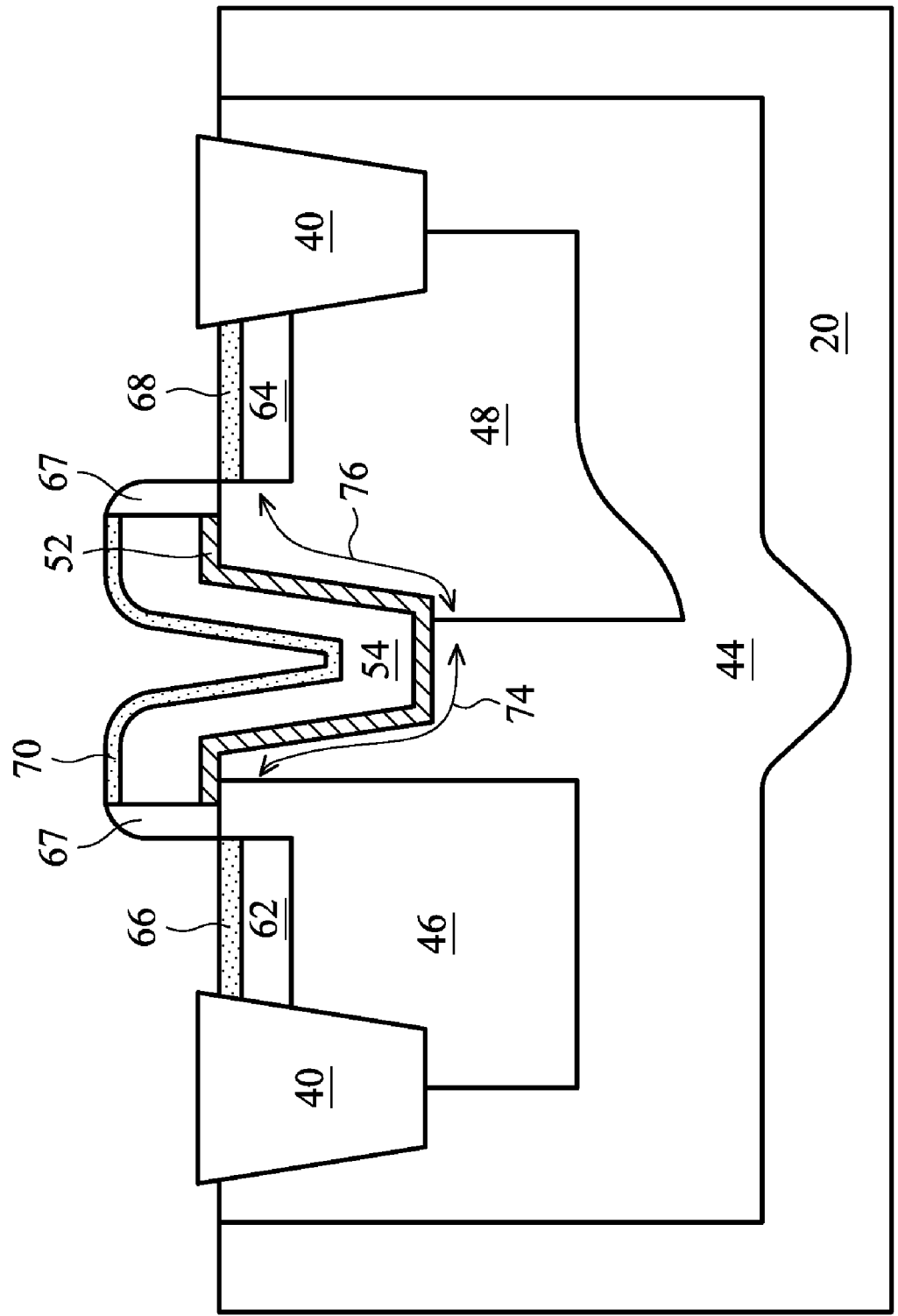

FIG. 10 illustrates the formation of the remaining portions of the HVMOS device, which includes source region 62, drain region 64, source silicide region 66, drain silicide region 68, gate silicide region 70 (if gate electrode 54 is formed of polysilicon), and gate spacers 67. Since whether a region is a source region or a drain region is often related to how it is used, throughout the description each of the source and drain regions may alternatively be referred to as a source/drain region. Source region 62 and drain region 64 are heavily doped with an n-type impurity. Silicide regions 66, 68 and 70 may be formed using the well-known salicide process. The formation details of source region 62, drain region 64, and silicide regions 66, 68, and 70 are well known in the art, and hence are not repeated herein.

In the resulting structure as shown in FIG. 10, the surface of a portion of semiconductor substrate 20 directly underlying gate electrode 54 is recessed. This advantageously turns a portion of channel (symbolized by arrow 74) from the horizontal direction to the vertical direction, and hence a longer channel may be achieved without increasing the chip area occupied by the HVMOS device. In other words, the chip area of the HVMOS device may be reduced if the same performance is to be achieved. Further, the effective width (the length of arrow 76) of the drift region is also increased. This causes the reduction of the electrical field on the drain side of the HVMOS device, and hence the breakdown voltage may be increased. Further, with the formation of the recess (opening $28_1$ as shown in FIG. 3), the location with the highest electrical field is moved from near the top surface of semiconductor substrate 20 deeper into semiconductor substrate 20. Such a change in the distribution of the electrical field not only results in the increase in the electrical field, but also causes reduction in the gate-induced drain leakage (GIDL).

Figure 11:
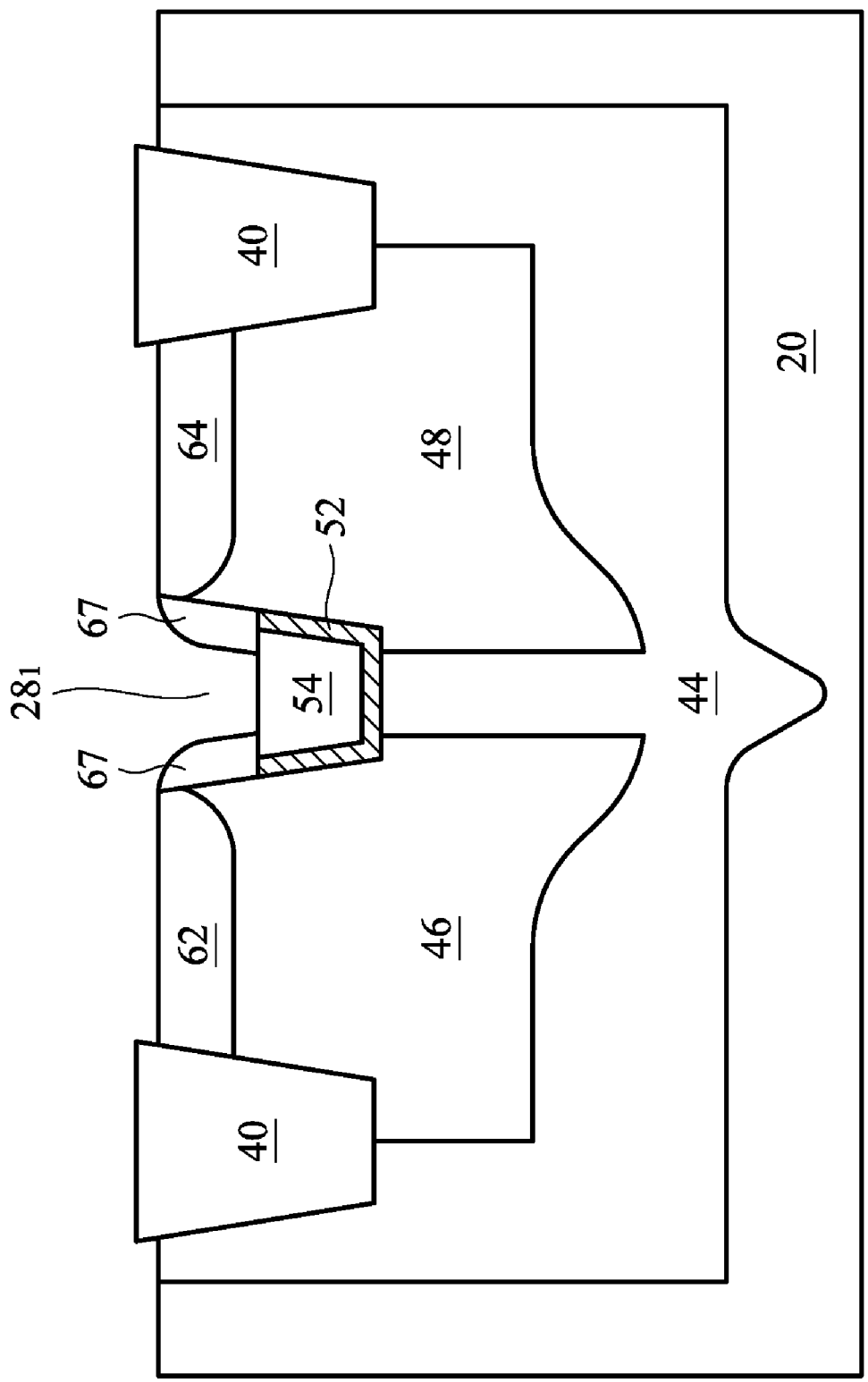
FIGS. 11 and 12 illustrate cross-sectional views of an alternative embodiment of the present invention.
Figure 12:
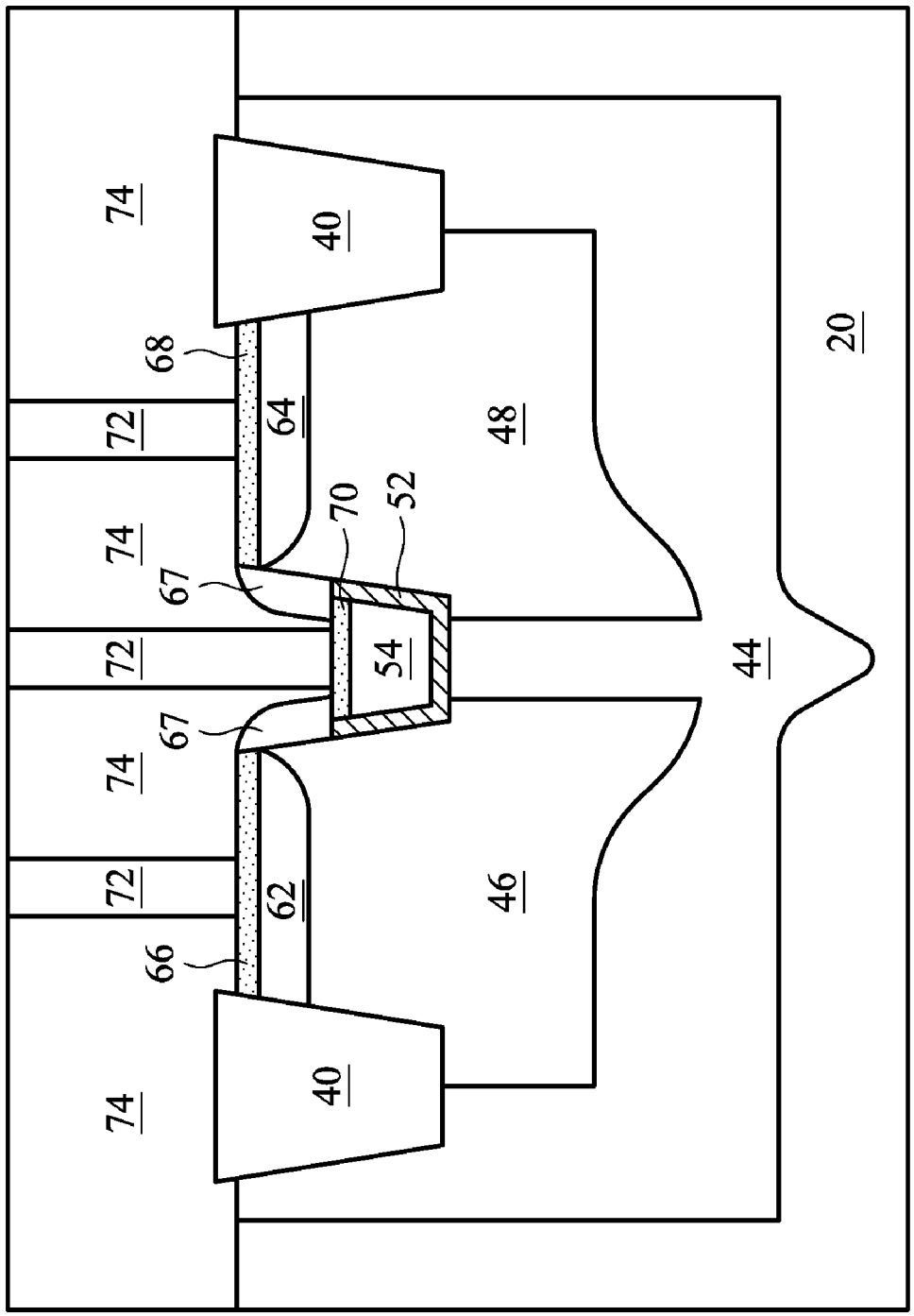

FIGS. 11 through 12 illustrate an alternative embodiment of the present invention. The initial steps of this embodiment are essentially the same as shown in FIGS. 2 through 8. Next, as shown in FIG. 11, gate dielectric 52 and gate electrode 54 are formed. Preferably, gate dielectric 52 is also highly conformal with substantially the same thicknesses at the bottom and on the sidewalls of opening $28_1$. Gate electrode 54 is highly non-conformal, and may be limited in the region in opening $28_1$. In this embodiment, gate electrode 54 does not include any portion directly over the top surfaces of NDD regions 46 and 48. In other words, gate electrode 54 is free from portions directly over the top surfaces of NDD regions 46 and 48.

Gate spacers 67, instead of being formed on sidewalls of gate electrode 54, are now formed on the sidewalls of opening $28_1$. Source region 62 and drain region 64 are formed by using gate spacers 67 as masks to implant semiconductor substrate 20. Preferably, source region 62 and drain region 64 are spaced apart from gate electrode 54 by the respective NDD regions 46 and 48.

FIG. 12 illustrates the formation of silicide regions 66, 68, and 70, contact plugs 72, and inter-layer dielectric (ILD) 74. The formation methods are known in the art, and hence are not repeated herein.

Please note that FIG. 11 (and FIG. 12) also shows a different structure as regarding the position of opening $28_1$ (the recess). In FIG. 11, opening $28_1$ extends into both NDD regions 46 and 48, although it may also extend only into NDD region 48, similar to the structure as shown in FIG. 10. Further, the gate structures (including gate dielectric 52, gate electrode 54, and gate spacers 67) shown in FIGS. 10 and 12 may be interchanged.

In the above-discussed exemplary embodiments, HVNMOS devices are illustrated. It is appreciated that HVPMOS devices may be formed using essentially the same process steps by inversing the conductivity types of various regions in FIGS. 10 and 12, for example, regions 44, 46, 48, 62 and 64.

The embodiments of the present invention have several advantageous features. The formation of the recess takes advantages of the existing reverse OD formation step, during which the excess portion of the dielectric material 32 (refer to FIGS. 4 and 5) is etched from active regions. Therefore, no additional mask and no additional steps are required. Due to the vertical structure, the HVMOS devices may occupy less chip area without sacrificing the breakdown voltage.

Although the present invention and its advantages have been described in detail, it should be understood that various changes, substitutions and alterations can be made herein without departing from the spirit and scope of the invention as defined by the appended claims. The features and embodiments as discussed in the preceding paragraphs, and various combinations of these features and embodiments, even if they may be disclosed in different embodiments, may also constitute separate embodiments, when applicable. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a semiconductor substrate;
   a high-voltage well (HVW) region in the semiconductor substrate;
   a first double diffusion (DD) region in the HVW region;
   a second DD region in the HVW region, wherein the first DD region and the second DD region are spaced apart from each other by an intermediate portion of the HVW region;
   a recess extending from a top surface of the semiconductor substrate into the intermediate portion of the HVW region and the second DD region;
   a gate dielectric extending into the recess and covering a bottom of the recess;
   a gate electrode over the gate dielectric;
   a first source/drain region in the first DD region; and
   a second source/drain region in the second DD region.

2. The integrated circuit structure of claim 1, wherein the first DD region, the second DD region, the first source/drain region, and the second source/drain region are of a first conductivity type, and wherein the HVW region is of a second conductivity type opposite the first conductivity type.

3. The integrated circuit structure of claim 1, wherein the bottom of the recess is higher than bottom surfaces of the first DD region and the second DD region.

4. The integrated circuit structure of claim 3, wherein the bottom of the recess is lower than bottom surfaces of the first source/drain region and the second source/drain region.

5. The integrated circuit structure of claim 1, wherein the recess comprises a first edge and a second edge opposing the first edge, wherein the first edge is in the second DD region, and the second edge is in the HVW region.

6. The integrated circuit structure of claim 1, wherein the recess comprises a first edge and a second edge opposing the first edge, wherein the first edge is in the second DD region, and the second edge is in the first DD region.

7. The integrated circuit structure of claim 1, wherein the first DD region comprises a first top surface being substantially flat, the second DD region comprises a second top surface being substantially flat, and wherein the gate electrode comprises a first portion directly over the first top surface of the first DD region, and a second portion directly over the second top surface of the second DD region.

8. The integrated circuit structure of claim 1, wherein the first DD region comprises a first top surface being substantially flat, the second DD region comprises a second top surface being substantially flat, and wherein the gate electrode does not have any portion directly over the first top surface of the first DD region and the second top surface of the second DD region.

9. The integrated circuit structure of claim 1 further comprising a shallow trench isolation (STI) region in the semiconductor substrate, wherein the bottom of the recess is substantially level with a bottom of the STI region.

10. An integrated circuit structure comprising:
    a semiconductor substrate;
    a high-voltage well (HVW) region of a first conductivity type in the semiconductor substrate;
    a first double diffusion (DD) region in the HVW region, the first DD region being of a second conductivity type opposite the first conductivity type;
    a second DD region of the second conductivity type in the HVW region, wherein the first DD region and the second DD region adjoin an intermediate portion of the HVW region between the first DD region and the second DD region;
    a recess extending from a top surface of the semiconductor substrate into the intermediate portion of the HVW region, wherein the recess comprises a first sidewall and a second sidewall opposing the first sidewall, and wherein the first sidewall is in the second DD region, and the second sidewall is in the intermediate portion of the HVW region;
    a gate dielectric continuously covering a first top surface of the first DD region and a second top surface of the second DD region, wherein the gate dielectric extends to a bottom of the recess;
    a gate electrode over the gate dielectric;
    a source region in the first DD region; and
    a drain region in the second DD region.

11. The integrated circuit structure of claim 10, wherein the bottom of the recess is higher than bottom surfaces of the first DD region and the second DD region, and lower than bottom surfaces of the source region and the drain region.

12. The integrated circuit structure of claim 10, wherein the first conductivity type is p-type, and the second conductivity type is n-type.

13. The integrated circuit structure of claim 10, wherein the first conductivity type is n-type, and the second conductivity type is p-type.

14. The integrated circuit structure of claim 10 further comprising a shallow trench isolation (STI) region in the semiconductor substrate and adjoining one of the source region and the drain region, wherein the bottom of the recess is substantially level with a bottom of the STI region.

15. An integrated circuit structure comprising:
    a semiconductor substrate;
    a high-voltage well (HVW) region of a first conductivity type in the semiconductor substrate;
    a first double diffusion (DD) region in the HVW region, the first DD region being of a second conductivity type opposite the first conductivity type;
    a second DD region of the second conductivity type in the HVW region, wherein the first DD region and the second DD region are spaced apart from each other;
    a gate dielectric over the HVW region, wherein the gate dielectric comprises a first portion lower than a first top surface of the first DD region and a second top surface of the second DD region, and wherein the first portion is between the first DD region and the second DD region;
    a gate electrode over the gate dielectric;
    a source region in the first DD region; and
    a drain region in the second DD region.

16. The integrated circuit structure of claim 15 further comprising a shallow trench isolation (STI) region in the semiconductor substrate, wherein the first portion of the gate dielectric has a bottom substantially level with a bottom of the STI region.

17. The integrated circuit structure of claim 15, wherein the gate dielectric further comprises a second portion directly over the first top surface of the first DD region, and a third portion directly over the second top surface of the second DD region.

18. The integrated circuit structure of claim 15, wherein the gate dielectric does not comprise any portion directly over the first top surface of the first DD region, or any portion directly over the second top surface of the second DD region.

19. The integrated circuit structure of claim 18, wherein a top surface of the gate electrode is lower than the first top surface of the first DD region and the second top surface of the second DD region, and wherein the integrated circuit structure further comprises a first dielectric spacer on a first sidewall of the first DD region, and a second dielectric spacer on a second sidewall of the second DD region.

20. The integrated circuit structure of claim 15, wherein the first top surface and the second top surface are substantially flat.

* * * * *